United States Patent [19]

Imondi et al.

[11] Patent Number: 4,736,342
[45] Date of Patent: Apr. 5, 1988

[54] METHOD OF FORMING A FIELD PLATE IN A HIGH VOLTAGE ARRAY

[75] Inventors: Giuliano Imondi, Rieti, Italy; Michael C. Smayling, Missouri City, Tex.; Sossio Vergara, Frattamaggiore, Italy; Sebastiano D'Arrigo, Houston, Tex.

[73] Assignee: Texas Instruments Incorporated, Dallas, Tex.

[21] Appl. No.: 798,269

[22] Filed: Nov. 15, 1985

[51] Int. Cl.⁴ .............. G11C 11/34; G11C 8/00; G11C 17/00
[52] U.S. Cl. .................. 365/185; 365/94; 365/53; 357/23.5
[58] Field of Search ............ 365/51, 53, 54, 94, 365/104, 185; 357/23.5

[56] References Cited

U.S. PATENT DOCUMENTS

| | | | |
|---|---|---|---|
| 4,185,319 | 1/1980 | Stewart | 365/51 X |
| 4,446,536 | 5/1984 | Rodgers | 365/185 X |
| 4,453,234 | 6/1984 | Uehida | 365/185 |
| 4,507,756 | 3/1985 | McElroy | 365/104 |
| 4,597,060 | 6/1986 | Mitchell et al. | 365/185 |
| 4,608,585 | 8/1986 | Keshtbod | 365/185 X |
| 4,612,629 | 9/1986 | Harari | 365/185 |

Primary Examiner—Stuart N. Hecker
Assistant Examiner—Alyssa H. Bowler
Attorney, Agent, or Firm—John G. Graham; Rodney M. Anderson

[57] ABSTRACT

An array of electrically programmable semiconductor memory cells of a type having electrically conducting odd and even row lines, left and right column and ground lines and field oxide regions separating adjacent left and right cells. The array has a field plate over the field oxide region which extends underneath both odd and even row lines. A driver is coupled to the odd and even row lines in order to drive one of them to substantially ground potential while the other is driven high to a cell selection voltage.

4 Claims, 3 Drawing Sheets

METHOD OF FORMING A FIELD PLATE IN A HIGH VOLTAGE ARRAY

BACKGROUND

The present invention relates to a method and structure for forming a field plate in a high voltage array in order to improve the isolation between adjacent cells separated by an isolating area.

In an array of EEPROM cells it is common to have a conducting line of polysilicon crossing the moat of every single cell. This polysilicon overlying a thick field oxide layer is a field transistor with a relatively high threshold voltage. During the WRITE operation this polysilicon line has 16 volts applied to it. Although the field transistor normally has a high threshold voltage it can not be made with a guarantee that it will be higher than 16 volts. Once the field transistor turns on due to the gate voltage on the polysilicon it causes a considerable degradation in the isolation between cells.

A known solution to this problem has been to use a polysilicon field plate connected to the substrate or $V_{ss}$ underneath the field transistor. Such a structure results in an increase in the cell size because of the space required to run a metal line coupled to all of the polysilicon field plates.

Accordingly, it is a principal object of the invention to provide an improved method and structure for ensuring the field transistor stays turned off and thereby enhancing the isolation between cells. It is a further object of the invention to provide a method for eliminating the separate field plate conducting line used in the prior art and thereby achieve a smaller cell size.

SUMMARY OF THE INVENTION

According to the invention there is provided an array of electrically programmable semiconductor memory cells having a plurality of left and right memory cells separated by respective field transistors and associated odd and even row lines, sense lines, and left and right column lines and metal ground lines. The array has electrically conducting field plates between the row line and the field oxide. The field plates are electrically isolated. Row line driver means drives an odd row line to ground whenever its associated even row line is driven high and vice versa. The voltage of the floating field plate will be less than ½ the voltage level applied to the selected row line.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
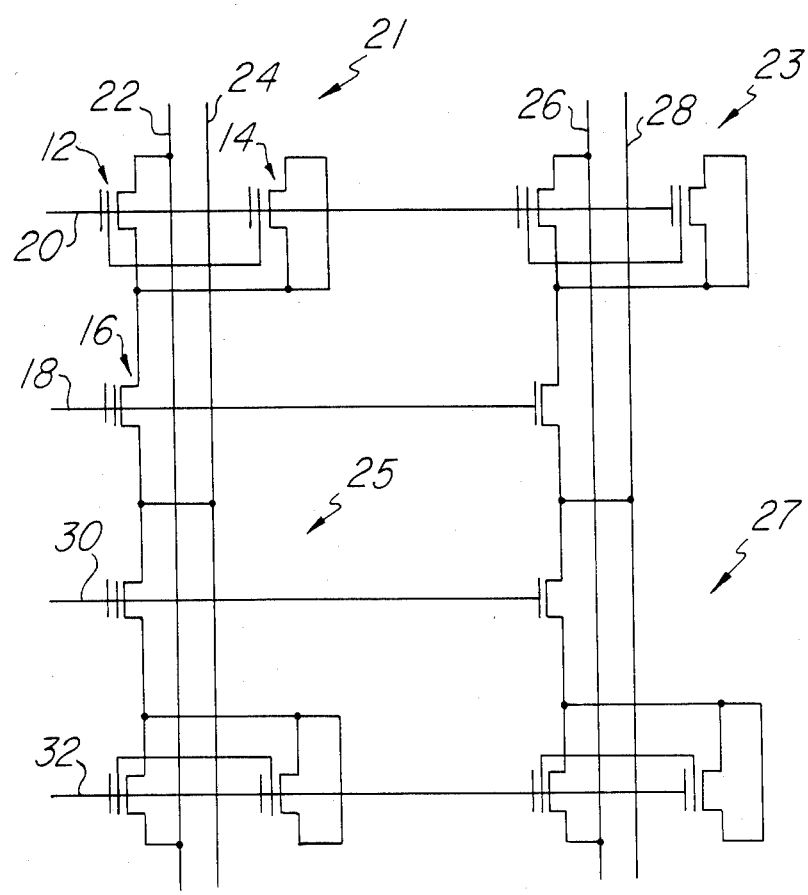
FIG. 1 is a circuit diagram of a portion of an array of EEPROMS to which the present invention is applied.

Referring to FIG. 1 there is shown an electrical circuit layout of a portion of an array of electrically programmable. erasable read only memory cells. In this case there is shown a portion of an array which includes a left odd cell 21, a right odd cell 23, a left even cell 25 and a right even cell 27. The left odd cell 21 includes a floating gate transistor 12, a tunnel device 14 and a left odd row transistor 16 whose gate is connected to an odd row line 18. An even row line 30 couples to the gates of the even row transistors of left even cell 25 and right even cell 27. Driving odd row line 18 high turns on the odd row transistors and selects the left odd cell 21 and the right odd cell 23 while driving the even row line 30 high results in the selection of left even cell 25 and right even cell 27. The left cells 21 and 25 are coupled to a left ground line 22 and a left column line 24 while right cells 23 and 27 are coupled to right ground line 26 and right column line 28, respectively.

Figure 2:
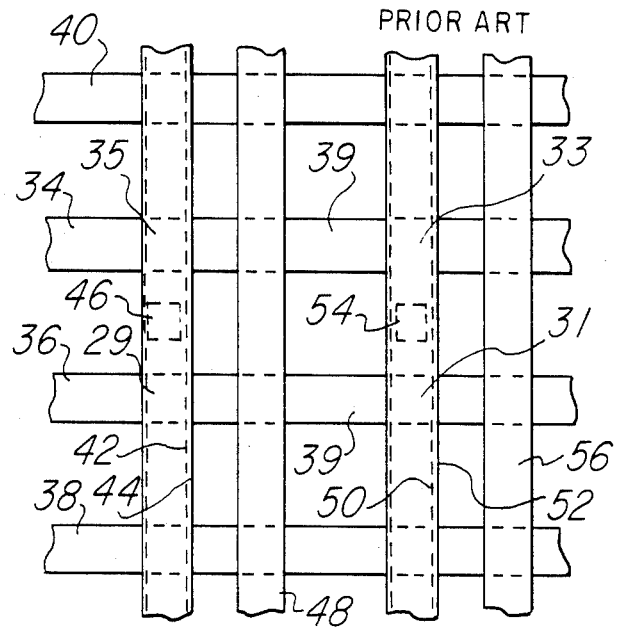
FIG. 2 is a greatly enlarged plan view of a small portion of a semiconductor chip showing the layout of the array conducting lines.
Figure 3:
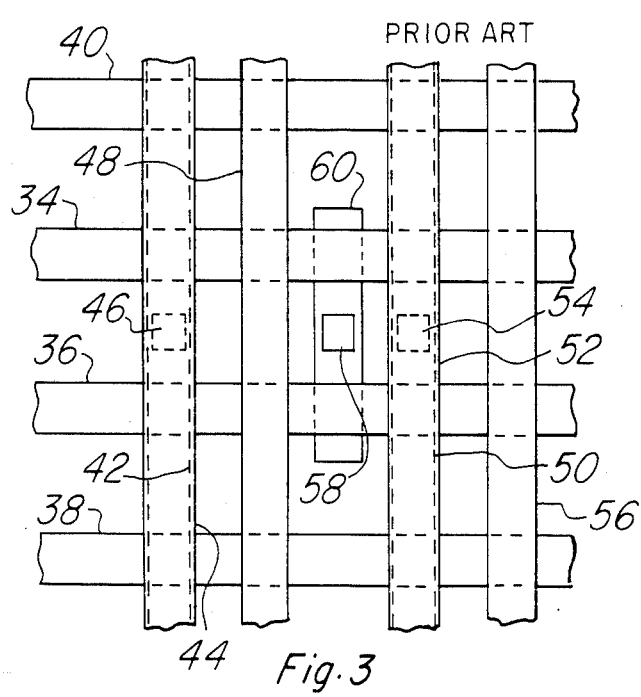
FIG. 3 is a view similar to that of FIG. 2 but including a field plate as used in prior devices.
Figure 4:
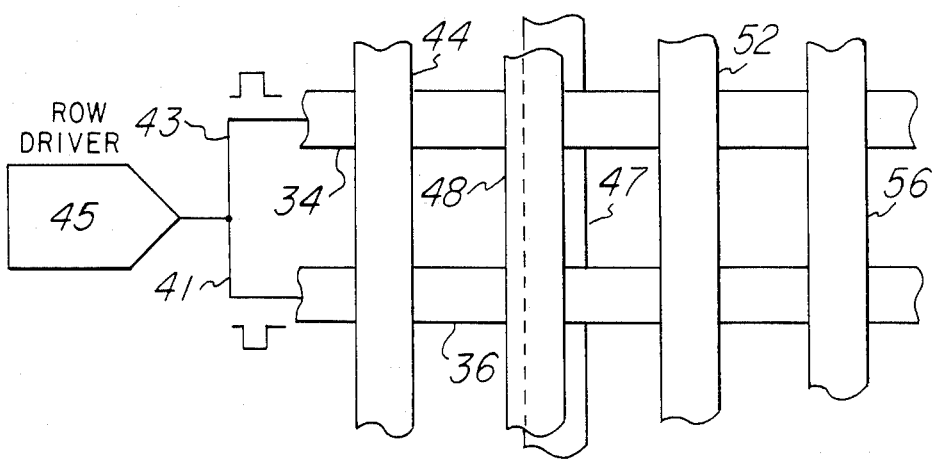
FIG. 4 is a view similar to that of FIG. 2 but showing a a preferred embodiment of a field plate according to the present invention.

A layout of conducting lines may be chosen as shown in FIG. 2. In FIGS. 2, 3, and 4 like reference numerals refer to like parts. Odd row line 34 and parallel even row line 36 are located between odd sense line 40 and even sense line 38. Running vertically and crossing the row and sense lines as illustrated in FIG. 2, left column line 44 overlies a moat region 42 and connects to the drains of a pair of left row transistors by contact 46. A left ground line 48 runs parallel and adjacent to column line 44. Similarly, a right column line 52 overlies a moat region 50 and connects to the drains of a pair of right row transistors by contact 54. A right ground line 56 runs parallel and adjacent to column line 52. A field transistor 39 separates a left odd row transistor 35 from a right odd row transistor 33 while another field transistor 39 separates a left even row transistor 29 from a right even row transistor 31. Each of the field transistors 39 are formed by the portion of respective row lines 36 and 34 that overlies a field oxide region (not shown) and underlying silicon substrate.

A major problem with the layout of FIG. 2 arises due to the application of a high selection voltage to one of the row lines. Since the threshold voltage of the field transistors is typically of the order of 11 to 12 volts and a typical selection voltage is about 16 volts such a voltage would turn on the field transistors and result in leakage current flowing under the field oxide. The way that this problem has previously been solved as shown in FIG. 3 has been to form a polysilicon field plate 60 over the field transistors beneath the row lines 34 and 36 and to couple this plate to ground (i.e. the substrate) by means of contact or interconnect 58 running to an overhead ground line (not shown). The disadvantage to this approach is that it requires extra space in order to accomodate the field plate 60 and the ground line (not shown) over the field plates 60 in the array.

Figure 5:
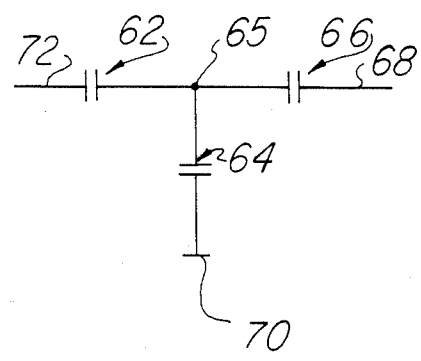
FIG. 5 is a circuit diagram of the equivalent circuit for the layout of FIG. 4.

One can avoid the need to have a ground line coupled to the field plates by isolating the field plates and introducing a row driver 45 as shown in FIG. 4 which drives odd row line 34 low whenever even row line 36 is driven high and vice versa. Since the field plate 47 is electrically isolated it can now be located beneath left ground line 48. Referring to FIG. 5 capacitor 62 represents the capacitance between the odd row line 34 and the field plate 47 the value of which is determined in part by the common area of overlap of line 34 and field plate 47. Capacitor 66 represents the capacitance between the even row line 36 and the field plate 47 the value of which is similarly determined by the overlap of line 36 and the field plate 47. Capacitor 64 represents the capacitance between the field plate and the substrate and its value is determined in part by the area of the field plate 47.

With both line 70 and line 68 at ground and line 72 at a high voltage corresponding to a row line selection voltage $V_r$ calculating of the voltage $V_f$ at terminal 65 corresponding to the field plate 47 where the values of the capacitance of capacitors 62 and 66 are assumed equal is as follows:

$$Vf = Vr \times \frac{C}{2C + Cs}$$

where C is the capacitance of capacitors 62 and 66 and Cs is the capacitance of capacitor 64. Thus, the voltage on the field plate 47 will always be less than ½ that of the row line selection voltage and the field transistors will always be turned off.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. In a semiconductor memory of the type having an array of electrically programmable memory cells arranged in rows and columns, each of said memory cells comprising a floating-gate transistor, and a row select transistor having a source-to-drain path connected between said floating-gate transistor and a column line and having a gate, wherein field oxide regions are disposed between adjacent memory cells in the same row, and wherein the gates of the row select transistors in each row are connected by way of a conducting row line to a driver associated with the row, said driver driving a voltage on said row line so that the floating-gate transistors in a selected row are connected to the associated column lines and so that the floating-gate transistors of the unselected rows are not connected to their associated column lines, the improvement comprising:

an electrically isolated conductive layer disposed over said field oxide regions between adjacent memory cells, wherein a plurality of said row lines are overlying said electrically isolated conductive layer and are separated therefrom by a dielectric layer so that the voltage on each of said overlying row lines is capacitively coupled to said electrically isolated conductive layer.

2. The improved semiconductor memory of claim 1, wherein said electrically isolated conductive layer is disposed perpendicular to said overlying row lines.

3. The improved semiconductor memory of claim 1 wherein the source-to-drain path of each of said floating-gate transistors in said memory cells is connected between said row select transistor and a ground line, said ground line being a conducting layer associated with each column of said memory cells;

and wherein said electrically isolated conductive layers are disposed parallel to said ground lines.

4. The improved semiconductor memory of claim 3, wherein each of said electrically isolated conductive layers is overlapped by one of said ground lines.

* * * * *